US012728456B2

(12) United States Patent
Stjernberg

(10) Patent No.: US 12,728,456 B2
(45) Date of Patent: Sep. 8, 2026

(54) CUTTING TOOL

(71) Applicant: SECO TOOLS AB, Fagersta (SE)

(72) Inventor: Jesper Stjernberg, Fagersta (SE)

(73) Assignee: SECO TOOLS AB, Fagersta (SE)

( * ) Notice: Subject to any disclaimer, the term of this patent is extended or adjusted under 35 U.S.C. 154(b) by 344 days.

(21) Appl. No.: 18/281,596

(22) PCT Filed: Mar. 14, 2022

(86) PCT No.: PCT/EP2022/056515
§ 371 (c)(1),
(2) Date: Sep. 12, 2023

(87) PCT Pub. No.: WO2022/194767
PCT Pub. Date: Sep. 22, 2022

(65) Prior Publication Data

US 2024/0139807 A1 May 2, 2024

(30) Foreign Application Priority Data

Mar. 17, 2021 (EP) .................................... 21163142

(51) Int. Cl.
*B22F 5/00* (2006.01)
*B22F 3/16* (2006.01)
(Continued)

(52) U.S. Cl.
CPC .................. *B22F 5/00* (2013.01); *B22F 3/16* (2013.01); *B22F 9/026* (2013.01); *B22F 9/04* (2013.01); *B23B 27/148* (2013.01); *C22C 1/051* (2013.01); *C22C 29/067* (2013.01); *C22C 29/08* (2013.01); *C23C 14/0641* (2013.01); *B22F 2005/001* (2013.01); *B22F 2009/041* (2013.01); *B22F 2009/042* (2013.01); *B22F 2201/11* (2013.01);
(Continued)

(58) Field of Classification Search
None
See application file for complete search history.

(56) References Cited

U.S. PATENT DOCUMENTS

2019/0024221 A1* 1/2019 Toufar .................. C22C 29/067

FOREIGN PATENT DOCUMENTS

EP 2006413 A 12/2008
JP 2012143862 A * 8/2012 ............ B23B 27/14

OTHER PUBLICATIONS

Topic—microstructure-magnetic properties WC-Co hardmetals—Mat. Sci. Eng. 2006 (Year: 2006).*

(Continued)

*Primary Examiner* — John Vincent Lawler
(74) *Attorney, Agent, or Firm* — Corinne R. Gorski

(57) ABSTRACT

A cutting tool insert has an optimal hardness and high toughness for demanding cutting operations in hardened steel and cast iron. The cutting tool includes a substrate of cemented carbide where the cemented carbide has hard constituents of tungsten carbide (WC) and a (Co) binder phase, chromium (Cr) and at least one additional element from the group: Vanadium (V), Niobium (Nb), Molybdenum (Mo) and Iron (Fe). The cemented carbide further has a Co-content of 3.50-4.20 wt % of the cemented carbide, a Cr-content of 0.31-0.38 wt % of the cemented carbide, a WC-content of at least 95.22 wt % of the cemented carbide and wherein the cemented carbide has a coercivity of 26-32 kA/m

16 Claims, 3 Drawing Sheets

(51) Int. Cl.

| | |
|---|---|
| ***B22F 9/02*** | (2006.01) |
| ***B22F 9/04*** | (2006.01) |
| ***B23B 27/14*** | (2006.01) |
| ***C22C 1/051*** | (2023.01) |
| ***C22C 29/06*** | (2006.01) |
| ***C22C 29/08*** | (2006.01) |
| ***C23C 14/06*** | (2006.01) |

(52) U.S. Cl.

CPC ....... *B22F 2201/20* (2013.01); *B22F 2301/20* (2013.01); *B22F 2302/10* (2013.01); *B22F 2998/10* (2013.01); *B22F 2999/00* (2013.01)

(56) References Cited

OTHER PUBLICATIONS

Suehara—JP 2012-143862 A—PCT D1-MT-WC carbide cutting tool—2012 (Year: 2012).*

* cited by examiner

CUTTING TOOL

RELATED APPLICATION DATA

This application is a § 371 National Stage Application of PCT International Application No. PCT/EP2022/056515 filed Mar. 14, 2022 with priority to EP 21163142.9 filed Mar. 17, 2021.

TECHNICAL FIELD

The present disclosure relates to a cutting tool particularly useful for machining of hardened steel or super alloys. The present disclosure also relates to a method for manufacturing the same.

BACKGROUND

Hardened steels cover a broad range of steels and properties and exist in many different conditions depending on purpose of use. As quenched, quenched and tempered, surface hardened (case hardened, nitrided, etc) are common conditions covering a hardness range up to 68 HRC. The purpose with hardening is to increase strength and wear resistance.

Steels suitable for hardening are medium to high carbon steels often with alloying additions of Cr, Ni, Mn and Mo. Depending on purpose, other alloying elements are added. Many of these alloying elements are carbide formers creating hard abrasive particles in the steels, which beside the high hardness, further decrease machinability and increase the wear on the cutting edge during machining.

When cemented carbide cutting tools are used in the machining of hardened steels, the tool is worn by different mechanisms such as abrasive and chemical wear, chipping and fracturing of the cutting edge. For a coated cutting tool normally having thin surface layers of wear resistant carbide, nitride, carbonitride and/or oxide compounds formed by various vapor deposition techniques, the coating contributes to increase the abrasive wear resistance, but it also acts as a thermal barrier for the diffusion of heat from the cutting surface into the underlying cemented carbide substrate. A high temperature within the edge region in combination with high cutting forces result in an increase of the creep deformation within the affected surface region of the substrate and the cutting edge deforms plastically. Cutting tools for machining of hardened steel must have good deformation resistance, wear resistance and toughness.

To meet these demands there is a need for a new cemented carbide with advanced properties to provide a cutting tool having a cemented carbide body with an optimal hardness and high toughness for demanding cutting operations in hardened steel and cast iron.

One object of the invention is to achieve a cutting tool having high hardness, high toughness and therewith improved cutting performance.

DETAILED DESCRIPTION

Definitions

The terminology used herein is for the purpose of describing particular aspects of the disclosure only and is not intended to limit the invention. As used herein, the singular forms “a”, “an” and “the” are intended to include the plural forms as well, unless the context clearly indicates otherwise.

Unless otherwise defined, all terms (including technical and scientific terms) used herein have the same meaning as commonly understood by one of ordinary skill in the art to which this disclosure belongs.

The term “cutting tool”, as used herein, is intended to denote cutting tools suitable for cutting by chip removal, such as turning, milling or drilling. Examples of cutting tools are indexable cutting inserts, solid drills or end mills.

The term “substrate” as used herein should be understood as a body onto which a coating could be deposited.

The term “pressing” as used herein concerns pressing a material powder, such as tungsten carbide (WC) together with cobalt (Co), between a punch and a die such that a green body is formed. The pressing may be uniaxial or multiaxial.

It should be noted that when using the term “thickness” to discuss a thickness of a layer, it is the average thickness of the discussed layer that is meant.

It should be noted that when using the term “grain size” to discuss a grain size of a substrate, it is the average grain size of the discussed substrate that is meant.

Invention

The present invention related to a cutting tool comprising a substrate of cemented carbide. The cemented carbide comprising hard constituents of tungsten carbide (WC) in a metallic binder phase (4) comprising cobalt (Co), where the cemented carbide further comprises chromium (Cr) and at least one additional element from the group consisting of: Vanadium (V), Niobium (Nb), Molybdenum (Mo) and Iron (Fe) and where the

- the Co-content is 3.50-4.20 wt % of the cemented carbide,
- the Cr-content is 0.31-0.38 wt % of the cemented carbide,
- the WC-content is at least 95.22 wt % of the cemented carbide,
- and that the cemented carbide has a coercivity of 26-32 kA/m.

The amount of Co binder phase is between 3.50-4.20 wt % of the cemented carbide. If the Co content is lower than 3.50 wt %, there is a high risk for porosity and the hardness of the substrate will be too high and the substrate will be brittle, whereas if the Co content is higher than 4.20 wt %, the hardness of the substrate will be too low.

The amount of Cr is between 0.31-0.38 wt % of the cemented carbide. If the Cr content is lower than 0.31 wt %, the inhibiting effect on the grain growth will be too small, whereas if the Cr content is higher than 0.38 wt %, there is a risk of the precipitation of unwanted Cr— carbides in the microstructure.

The addition of the additional element(s) selected from the group consisting of: Vanadium (V), Niobium (Nb), Molybdenum (Mo) and Iron (Fe) are done in order to achieve solid solution hardening and control the grain growth of the WC and thus achieving the necessary properties like coercivity, hardness, toughness etc.

In one embodiment of the present invention, the cemented carbide comprises 0.008-0.09 wt % V, preferably 0.01-0.09 wt % V, more preferably 0.01-0.06 wt % V.

In one embodiment of the present invention, wherein the V+Nb is maximum 0.12 wt % of the cemented carbide.

In one embodiment of the present invention the V+Nb+Mo+Fe content is maximum 0.2 wt % of the cemented carbide.

In one embodiment of the present invention, the cemented carbide has a hardness of 1960-2020 HV30, preferably 1960-2010 HV30.

In one embodiment of the present invention, the cutting tool has a fracture toughness of 8.6-9.7 $MPam^{-1/2}$, preferably 9-9.6 $MPam^{-1/2}$.

In one embodiment of the present invention, the cutting tool has a coercivity of 27-31 kA/m.

In one embodiment of the present invention, the cutting tool has a Cr-content of the binder phase of 8-10 wt %.

In one embodiment of the present invention, the cutting tool has a coating, preferably a PVD or CVD coating. Most preferably, the coating is a homogenous or nanolayered PVD coating with a thickness of 1.5-5 μm.

In one embodiment of the present invention, the coating comprises a 0.2-1 μm TiAlN inner layer, a 1-4 μm thick nanolaminate of alternating TiAlN/TiSiN layer, and optionally a 0.2-1 μm outer layer, of either TiAlN or TiSiN. The layers of the nanolaminate are about 10-40 nm thick. Preferably, the composition of the TiAlN-layers of the coating is $(Ti_xAl_{1-x})N$, 0.5<x<0.7, and the composition of the TiSiN-layers is $(Ti_ySi_{1-y})N$, 0.05<y<0.25.

The present invention also relates to a method of making a cutting tool as described above. The method comprising:

a. providing a powder composition comprising WC grains having a FSSS mean grain size in the interval 0.76-0.90 μm, preferably in the interval 0.78-0.88 μm, most preferably in the interval 0.79-0.85 μm,
   3.50-4.20 wt % Co,
   0.31-0.38 wt % Cr and
   raw material powders comprising at least one of the following elements: V, Nb, Mo and Fe,
b. wet milling the powder composition, a polymer forming agent and a milling liquid to form a slurry,
c. spray drying the slurry to form a granulate,
d. forming the granulate to a green body of desired shape and dimension,
e. sintering the green body to a sintered body having a smaller volume than the green body.

By raw material powders comprising at least one of the following elements V, Nb, Mo and Fe is herein meant carbides, nitrides, carbonitrides or the metallic form of those elements. Cr is usually added as a carbide powder, $Cr_3C_2$. However, Cr can also be added as a nitride powder.

The powder composition is mixed with a polymer forming agent, usually PEG (polyethylene glycol) or wax, and a milling liquid to form a slurry. The milling liquid can be any liquid common in the art of making cemented carbides, preferably a mixture of water and an alcohol is used. The slurry is wet milled in a mill, e.g. a ball mill or an attritor mill. The type of mill and the duration of the milling step, is determined by the person skilled in the art.

The slurry is the subjected to a spray drying step to form granules. The granules are then formed into a green body by any of the following techniques: pressing, injection molding and extrusion. Preferably, pressing is used.

The green bodies are then sintered into a cemented carbide tool. Any sintering technique common in the art of sintering cemented carbides can be used, like e.g. vacuum sintering, HIP etc. The sintering temperature is typically between 1300 and 1580° C., preferably between 1360 and 1450° C.

In one embodiment of the present invention, a wear resistant coating having a thickness above 1.5 μm is deposited on the substrate, preferably the coating is deposited using PVD or CVD technique. Most preferably, the cutting tool is provided with a homogenous or nanolayered PVD coating with a thickness of 1.5-5 μm.

In one embodiment of the present invention, the coating deposited onto the substrate is a PVD coating comprising a 0.2-1 μm TiAlN inner layer, a 1-4 μm thick nanolaminate of alternating TiAlN/TiSiN layer, and optionally a 0.2-1 μm outer layer, of either TiAlN or TiSiN. The layers of the nanolaminate are about 10-40 nm thick. Preferably, the composition of the TiAlN-layers of the coating is $(Ti_xAl_{1-x})N$, 0.5<x<0.7, and the composition of the TiSiN-layers is $(Ti_ySi_{1-y})N$, 0.05<y<0.25.

Methods

Grain Size Determination of Tungsten Carbide Powder

The grain size of the tungsten carbide powder in the raw material was measured according to Fisher sub sieve sizer (FSSS) according to ASTM B330-20.

Vickers Hardness

The hardness is determined by Vickers hardness and a load of 30 kg, HV30. The equipment used was a Future-Tech FV300 hardness meter with a CCD-camera and measuring computer. Five indentations are made and measured with the measuring computer, which automatically calculate the hardness according to the following formula:

$$HV = \frac{P\ x\ 1.8544}{d^2}\text{kgf/mm}^2$$

P=Load in kilogram force (kgf)

d=Average length of the diagonals of the indentations in mm

The distance between the indentations is at least 3 times the length of the indentation diagonals.

Accuracy of the method is ±2%

Coercivity

The coercivity (Hc) is determined in a Koercimeter by measuring the reversed magnetic field required to fully demagnetize a sample that is magnetized to saturation. The coercivity of the sample is related to the volume ratio of Cobalt (Co) in the sample and the grain size of the carbides in the sample.

S-Value

The degree of magnetic saturation may be expressed as the S-value.

$$S = \frac{\sigma_s}{16.1} * 100[\%]$$

where $\sigma_s$ is the measured magnetic moment (Ma) of the binder phase in $\mu Tm^3\ kg^{-1}$ and where 16.1 $\mu Tm^3\ kg^{-1}$ is the magnetic moment of pure cobalt. The S-value depends on the content of W in the binder phase and increases with a decreasing tungsten content.

Shrinkage

The shrinkage is equal to the shrinkage of the pressed body during the sintering process in percent and is measured in the horizontal plan. For a green body manufactured by pressing the body normally shrinks about 17% linearly.

Fracture Toughness

The fracture toughness is determined by using the Palmqvist method, also called the Palmqvist toughness test, according to ISO28079:2009. In the method the fracture toughness of the cemented carbide is represented by the critical stress intensity factor, $K_{1c}$. Vicker indentations are made using a load of 30 kgf and the lengths of the cracks from the corners of the indentations are measured to determine the fracture toughness. The Palmqvist fracture toughness, $K_{1c}$, is given by:

$$K_{1c} = 0.0028\sqrt{HV}\sqrt{\frac{P}{T}}\ [MPam^{-1/2}]$$

where

HV ($N/mm^2$ or MPa) is the Vickers hardness
P (N) is the indentation load
T (mm) is the total crack length

BRIEF DESCRIPTION OF THE DRAWINGS

The invention will now be explained more closely by the description of different aspects of the invention and with reference to the appended figures.

EXAMPLES

Figure 1:
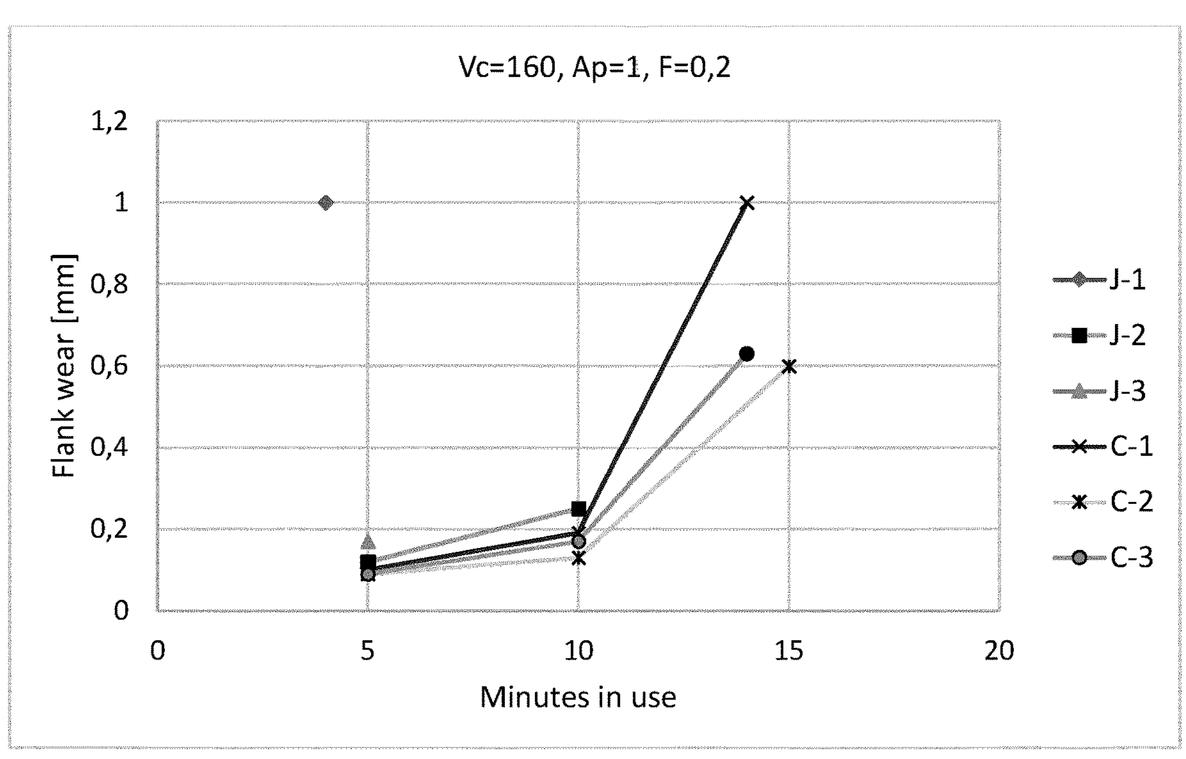
FIG. 1 shows a diagram comparing the tool life of a cutting tool insert according to the disclosure and a comparative cutting tool insert at cutting speeds 160 m/s.
Figure 2:
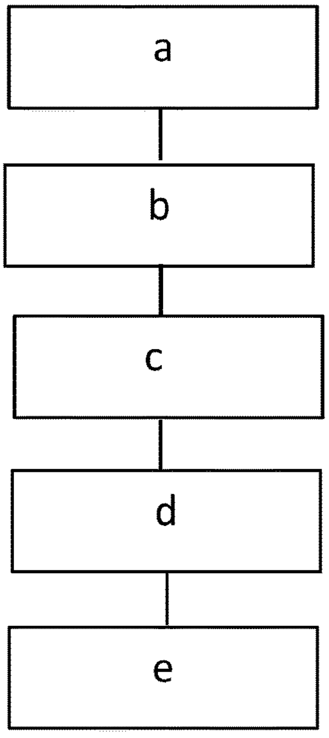
FIG. 2 shows a block diagram of an example method of manufacturing the cutting tool insert where the steps A-E corresponds to the steps a-e in claim 12.

Exemplifying embodiments of the present disclosure will be described more fully hereinafter and with reference to the drawings. The device and method disclosed herein may, however, be realized in many different forms and should not be construed as being limited to the aspects set forth herein. Cutting tool inserts were manufactured and analyzed. Some of the inserts were evaluated in cutting tests.

Manufacturing of Cutting Inserts

Substrates

Cemented carbide substrates of style SNUN12048 were manufactured for samples A-J. Sample C and sample J were also manufactured in style CNMG. The substrates were produced from raw material powders all containing tungsten carbide (WC), cobalt (Co) powder and chromium carbide ($Cr_3C_2$) powder according to the composition shown in Table 1. Some samples also contained at least one additional powder element from the group consisting of: Vanadium (V), Niobium (Nb), Molybdenum (Mo) and Iron (Fe). The composition ratio for each sample is shown in Table 1. The carbon concentration used in the samples were estimated from the phase diagram of the system 4 wt % Co, 0.36 wt % Cr, and the remaining part WC, and the knowledge that approx. 0.09 wt % C is lost during sintering.

The type of WC used for samples A-H had an average grain size of 0.85 μm as measured with FSSS. For comparative sample J the type of WC had an average grain size of 0.6 μm as measured with FSSS.

TABLE 1

| Sample | C (wt %) | Co (wt %) | Cr (wt %) | V (wt %) | Fe (wt %) | Nb (wt %) | Mo (wt %) | W (wt %) |
|---|---|---|---|---|---|---|---|---|
| A Invention | 6.01 | 3.9 | 0.38 | 0.05 | 0.05 | — | 0.05 | Bal. |
| B invention | 5.98 | 4 | 0.35 | 0.02 | 0.02 | — | — | Bal. |
| C invention | 6.00 | 4 | 0.36 | 0.01 | — | — | — | Bal. |
| D invention | 6.00 | 4.2 | 0.38 | 0.02 | — | 0.08 | 0.02 | Bal. |
| E comparative | 6.01 | 3.5 | 0.31 | — | — | — | — | Bal. |
| F comparative | 5.98 | 4 | 0.35 | — | — | — | — | Bal. |
| G comparative | 6.01 | 4 | 0.35 | — | — | — | — | Bal. |
| H comparative | 5.97 | 4 | 0.4 | — | — | — | — | Bal. |
| J comparative | 5.96 | 5.0 | 0.37 | — | — | — | — | Bal. |

The powders for each sample were milled together with a milling liquid and an organic binder being Polyethylene glycol (PEG) in a ball mill. The milling liquid consisted of water and ethanol. The slurry formed was dried in a spray dryer and thereafter pressed to inserts in a pressing operation at about 172 MPa. All powder batches for samples/variants except samples C and J were milled in 1 kg batches and spray dried in a lab-spray. Samples C and J were milled and spray dried in full-scale production. The pressed samples were sintered in vacuum for 30 minutes followed by 30 minutes at an Ar pressure of 30 Bar at a temperature of about 1390° C.

The coercivity (Hc), degree of magnetic moment (S), hardness (HV30), strength toughness ($K_{1C}$), (ds) and shrinkage from pressed to sintered powder were measured on the sintered samples. The result is shown in Table 2.

TABLE 2

| Sample | Hc [kA/m] | S [%] | HV30 | $K_{1C}$ [$MPam^{-1/2}$] | ds | Shrinkage (%) |
|---|---|---|---|---|---|---|
| A Invention | 29.8 | 67.37 | 1978 | 9.1 | 15.10 | 17.62 |
| B invention | 28.3 | 71.59 | 1966 | 9.1 | 15.10 | 17.49 |
| C invention | 30.3 | 78.73 | 2002 | 9.1 | 15.15 | 17.94 |
| D invention | 30.5 | 75.16 | 1970 | 9.2 | 15.07 | 17.44 |
| E comparative | 26.6 | 65.26 | 1968 | 8.8 | 15.20 | 17.21 |
| F comparative | 26.1 | 71.59 | 1976 | 9.1 | 15.13 | 17.23 |
| G comparative | 27.5 | 81.17 | 1972 | 9.2 | 15.11 | 17.26 |
| H comparative | 28.4 | 62.01 | 1941 | 9.1 | 15.13 | 17.56 |
| J comparative | 32.2 | 90.26 | 1998 | 9.8 | 15.02 | 20.08 |

All sintered samples in Table 2 had a porosity of A00 according to ISO 4499-4:2016 (E), i.e. no pores detected at a magnification of ×100.

Coating of Samples C and J

Substrates of sample C and sample J were deposited with a 2.6 μm thick PVD coating, the samples are hereinafter named coated sample C and coated sample J. The PVD coating has an inner layer of 0.3 μm TiAlN closes to the substrate followed by a 2.3 μm thick nanolaminate of TiAlN/TiSiN, and a thin outer layer of TiSiN. The layers of the nanolaminate is about 20-40 nm The composition of the TiAlN-layers of the coating is $(Ti_{0.33}Al_{0.67})N$ and the composition of the TiSiN-layers is $(Ti_{0.90}Si_{0.10})N$.

Cutting Tests

Longitudinal turning was performed by comparing the performance of coated samples C and J at the same cutting conditions on a workpiece material of toughened steel. The chemical composition and mechanical properties of the workpiece material are presented in Table 1 and Table 2, respectively.

The cutting data used:

cutting speed, $v_c$: 160 m/min cutting feed, f: 0.20 mm/revolution depth of cut, ap: 1 mm Coolant was used.

Work piece material: Orvar Supreme from Uddeholm being toughened and with a hardness of 48 HRC.

The cutting tools used had CNMG120408 insert geometry.

The tool life of the cutting tools inserts was determined by looking at the flank wear (W) of the inserts after 5, 10 and 15 minutes cutting time, see Table 3 and also FIG. 1. The tests were terminated when the flank wear had passed a maximum value of 0.2 mm or tool breakage.

3 edges of each tool were tested and the result can be seen in Table 3 below.

TABLE 3

| Sample | Tool life (min) |
|---|---|
| C-1 (Invention) | 14 |
| C-2 (Invention) | 15 |
| C-3 (Invention) | 14 |
| J-3 (Comparative) | 4 |
| J-4 (Comparative) | 10 |
| J-5 (Comparative) | 5 |

From FIG. 1 it can be seen that the average tool life at a cutting speed of 160 m/min for three cutting edges according to a cutting tool of the present disclosure are at least twice the average tool life of the three cutting edges of the comparative cutting tool. FIG. 1 also shows that the cutting edge having the shortest tool life of the cutting tool according to the present disclosure sample C, is longer to the longest tool life of the comparative cutting tool, sample J.

Figure 3A:
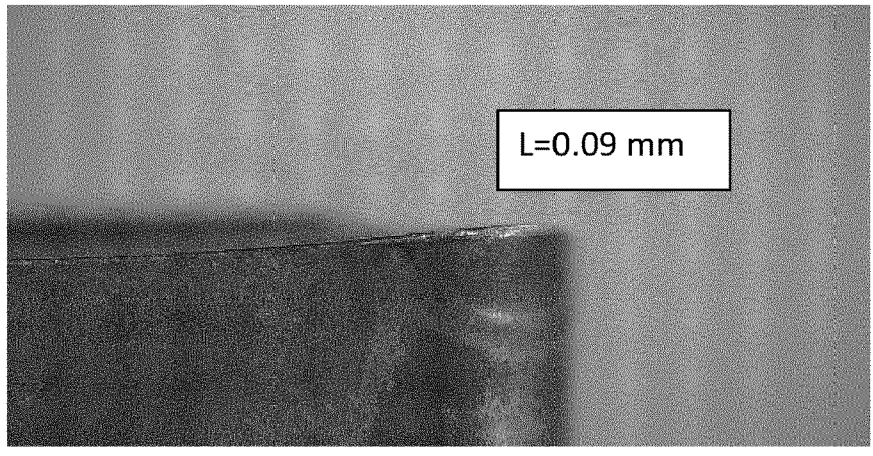
FIGS. 3*a*, 3*b* and 3*c* show photographs of the wear of a cutting tool insert according to the disclosure during machining tests after 5, 10 and 15 minutes respectively.
Figure 3B:
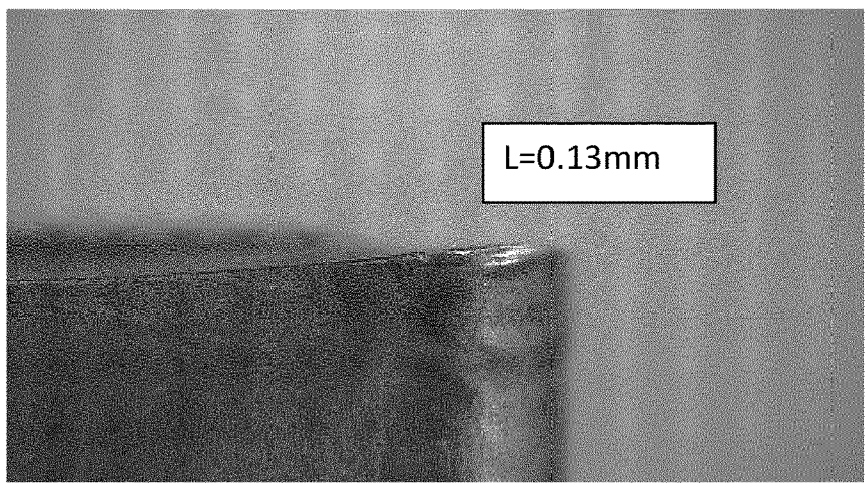
Figure 3C:
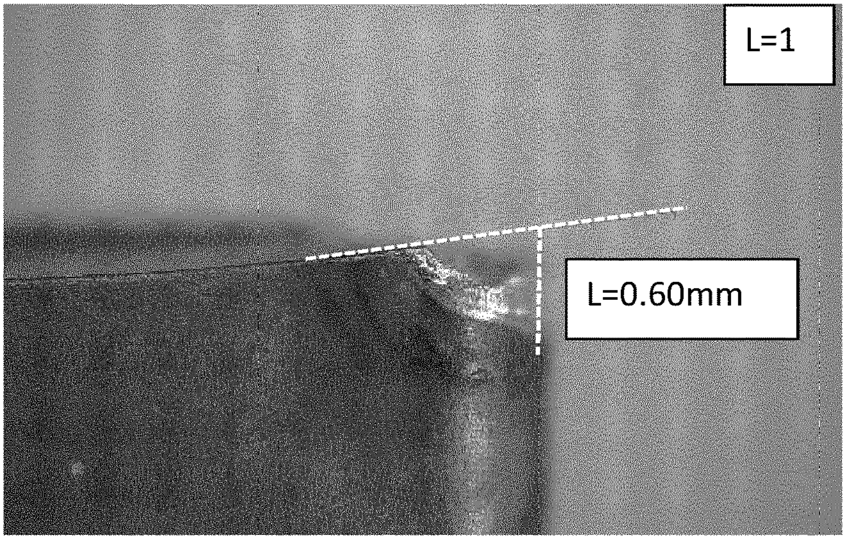

FIGS. 3*a*-3*c* shows edge C-2 after 5, 10 and 15 minutes of machining. As can be seen the edge was not exceeding flank wear of 0.2 mm before the control at 15 minutes.

Figure 4A:
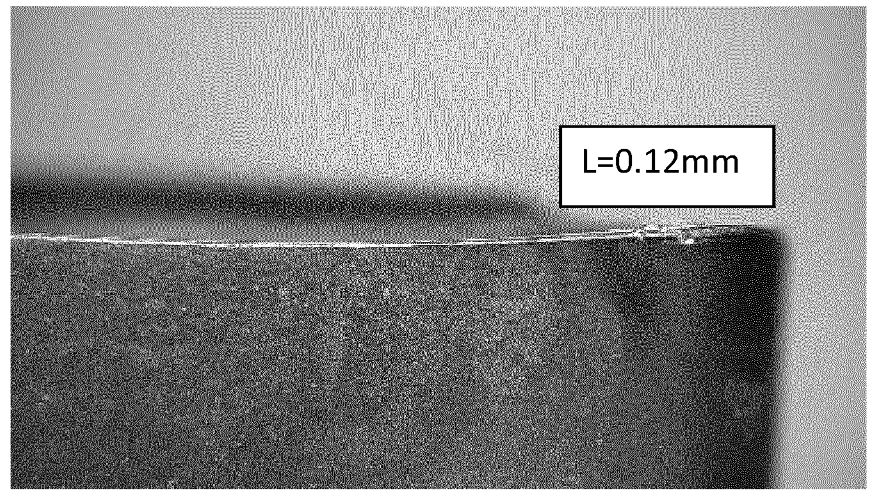
FIGS. 4*a* and 4*b* show photographs of the wear of a comparative cutting tool insert during machining tests after 5 and 10 minutes respectively.
Figure 4B:
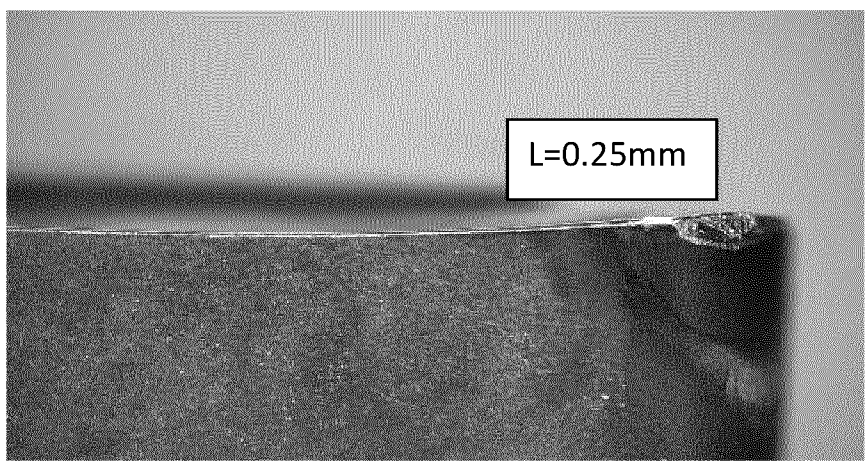

FIGS. 4*a* and 4*b* show the edge J-4 after 5 and 10 minutes of machining, respectively. As can be seen from FIG. 4*b* the flank face was more than 0.2 mm already at the control after 10 minutes machining.

As can be seen from the machining test sample C is superior to comparative sample J in turning operations in toughened steel.

The combination of low cobalt content and a coarser WC grain size provide for a cutting insert having both improved cutting performance as well as improved properties when it comes to shrinkage after sintering.

The invention claimed is:

1. A cutting tool insert comprising a substrate of cemented carbide, the cemented carbide comprising hard constituents of tungsten carbide in a metallic binder phase comprising cobalt (Co), wherein the cemented carbide further comprises chromium (Cr) and at least one additional element from the group consisting of: Vanadium (V), Niobium (Nb), Molybdenum (Mo) and Iron (Fe), wherein a content of the Co is 3.50-4.20 wt % of the cemented carbide, a content of the Cr is 0.31-0.38 wt % of the cemented carbide, a content of the WC is at least 95.22 wt % of the cemented carbide, and the cemented carbide has a coercivity of 26-32 kA/m.

2. The cutting tool insert according to claim 1, wherein the cemented carbide comprises 0.01-0.09 wt % V.

3. The cutting tool insert according to claim 1, wherein the V+Nb is a maximum 0.12 wt % of the cemented carbide.

4. The cutting tool insert according to claim 1, wherein a content of V+Nb+Mo+Fe is a maximum 0.2 wt % of the cemented carbide.

5. The cutting tool insert according to claim 1, wherein the cemented carbide has a hardness of 1960-2020 HV30.

6. The cutting tool insert according to claim 1, wherein a fracture toughness is 8.6-9.7 $MPam^{-1/2}$.

7. The cutting tool insert according to claim 1, wherein the coercivity is 27-31 kA/m.

8. The cutting tool insert according to claim 1, wherein the Cr-content of the metallic binder phase is 8-10 wt %.

9. The cutting tool insert according to claim 1, wherein a coating is deposited on the substrate.

10. The cutting tool insert according to claim 9, wherein the coating is a PVD or a CVD coating.

11. A cutting tool insert comprising:

a substrate of cemented carbide, the cemented carbide comprising hard constituents of tungsten carbide (WC) in a metallic binder phase including cobalt (Co), where the cemented carbide further comprises chromium (Cr) and at least one additional element from the group consisting of: Vanadium (V), Niobium (Nb), Molybdenum (Mo) and Iron (Fe), wherein a Co-content is 3.50-4.20 wt % of the cemented carbide, a Cr-content is 0.31-0.38 wt % of the cemented carbide, a WC-content is at least 95.22 wt % of the cemented carbide, the cemented carbide has a coercivity of 26-32 kA/m; and wherein the cemented carbide includes 0.01-0.09 wt % V; or wherein a V+Nb is maximum 0.12 wt % of the cemented carbide; or wherein a V+Nb+Mo+Fe content is maximum 0.2 wt % of the cemented carbide.

12. The cutting tool according to claim 11, wherein the cemented carbide comprises 0.01-0.06 wt % V.

13. A method for manufacturing a cemented carbide cutting tool insert according to claim 1, the method comprising:

providing a powder composition comprising WC grains having a FSSS mean grain size in an interval of 0.76-0.90 μm, 3.50-4.20 wt % Co, 0.31-0.38 wt % Cr and raw material powders comprising at least one of the following elements: V, Nb, Mo and Fe;

wet milling the powder composition, a polymer forming agent and a milling liquid to form a slurry;

spray drying the slurry to form a granulate;

forming the granulate into a green body of a desired shape and dimension; and sintering the green body to a sintered body having a smaller volume than the green body.

14. The method according to claim 13, wherein forming of the green body is made by any of the following: pressing, injection molding and extrusion.

15. The method according to claim 13, further comprising coating the sintered body with a wear resistant coating having a thickness above 1.5 μm.

16. The method according to claim 15, further comprising coating the sintered body by PVD or CVD.

* * * * *